United States Patent
Takagi et al.

(10) Patent No.: US 8,580,093 B2
(45) Date of Patent: *Nov. 12, 2013

(54) AL-NI-LA-CU ALLOY SPUTTERING TARGET AND MANUFACTURING METHOD THEREOF

(75) Inventors: Katsutoshi Takagi, Hyogo (JP); Masaya Ehira, Hyogo (JP); Yuki Iwasaki, Hyogo (JP); Hiroshi Goto, Hyogo (JP)

(73) Assignees: Kobelco Research Institute Inc., Kobe-shi (JP); Kobe Steel, Ltd., Kobe-shi (JP)

( * ) Notice: Subject to any disclaimer, the term of this patent is extended or adjusted under 35 U.S.C. 154(b) by 427 days.

This patent is subject to a terminal disclaimer.

(21) Appl. No.: 12/415,379

(22) Filed: Mar. 31, 2009

(65) Prior Publication Data

US 2009/0242395 A1 Oct. 1, 2009

(30) Foreign Application Priority Data

Mar. 31, 2008 (JP) .................................. 2008-093071

(51) Int. Cl.
*C23C 14/00* (2006.01)
*C25B 11/00* (2006.01)
*C25B 13/00* (2006.01)

(52) U.S. Cl.
USPC ................... 204/298.13; 204/298.12; 164/19; 164/484

(58) Field of Classification Search
USPC ................... 204/298.13, 298.12; 164/19, 484
See application file for complete search history.

(56) References Cited

U.S. PATENT DOCUMENTS

| | | | |
|---|---|---|---|
| 5,514,909 | A | 5/1996 | Yamamoto et al. |
| 6,033,542 | A | 3/2000 | Yamamoto et al. |

(Continued)

FOREIGN PATENT DOCUMENTS

| | | |
|---|---|---|
| JP | 9-248665 | 9/1997 |
| JP | 10-147860 | 6/1998 |

(Continued)

OTHER PUBLICATIONS

"Grain size." McGraw-Hill Dictionary of Scientific and Technical Terms. McGraw-Hill Companies, Inc., 2003. Answers.com May 11, 2012. http://www.answers.com/topic/grain-size.*

(Continued)

*Primary Examiner* — Keith Hendricks
*Assistant Examiner* — Ibrahime A Abraham
(74) *Attorney, Agent, or Firm* — Oblon, Spivak, McClelland, Maier & Neustadt, L.L.P.

(57) ABSTRACT

The present invention provides a technique capable of decreasing a generation of splashing upon depositing by using an Al—Ni—La—Cu alloy sputtering target comprising Ni, La, and Cu. The invention relates to an Al—Ni—La—Cu alloy sputtering target comprising Ni, La and Cu, in which (1) a total area of an Al—Ni intermetallic compound mainly comprising Al and Ni and having an average grain size of 0.3 µm or more and 3 µm or less is 70% or more by area ratio based on an entire area of the Al—Ni intermetallic compound, and (2) a total area of an Al—La—Cu intermetallic compound mainly comprising Al, La and Cu and having an average grain size of 0.2 µm or more and 2 µm or less is 70% or more by area ratio based on an entire area of the Al—La—Cu intermetallic compound, in a case where a portion of the sputtering target is observed within a range of from ¼t (t: thickness) to ¾t along a cross section vertical to a plane of the sputtering target by using a scanning electron microscope at a magnification of 2000.

20 Claims, 9 Drawing Sheets

(56) References Cited

U.S. PATENT DOCUMENTS

| | | |
|---|---|---|
| 6,096,438 A | 8/2000 | Takagi et al. |
| 6,218,206 B1 | 4/2001 | Inoue et al. |
| 6,252,247 B1 | 6/2001 | Sakata et al. |
| 7,098,539 B2 | 8/2006 | Gotoh et al. |
| 7,154,180 B2 | 12/2006 | Gotoh et al. |
| 7,262,085 B2 | 8/2007 | Gotoh et al. |
| 7,365,810 B2 | 4/2008 | Gotoh et al. |
| 7,411,298 B2 | 8/2008 | Kawakami et al. |
| 2003/0047812 A1 | 3/2003 | Hagihara et al. |
| 2003/0052000 A1* | 3/2003 | Segal et al. .............. 204/298.13 |
| 2006/0091792 A1 | 5/2006 | Kugimiya et al. |
| 2006/0180250 A1 | 8/2006 | Kugimiya et al. |
| 2006/0181198 A1 | 8/2006 | Gotoh et al. |
| 2006/0237849 A1 | 10/2006 | Gotoh et al. |
| 2006/0275618 A1 | 12/2006 | Kugimiya et al. |
| 2007/0040173 A1 | 2/2007 | Kugimiya et al. |
| 2007/0278497 A1 | 12/2007 | Kawakami et al. |
| 2008/0081532 A1 | 4/2008 | Okuno |
| 2008/0121522 A1 | 5/2008 | Ehira et al. |
| 2008/0223718 A1 | 9/2008 | Takagi et al. |
| 2008/0315203 A1 | 12/2008 | Hino et al. |
| 2009/0001373 A1 | 1/2009 | Ochi et al. |
| 2009/0004490 A1 | 1/2009 | Gotou et al. |
| 2009/0011261 A1 | 1/2009 | Gotou |
| 2009/0026072 A1 | 1/2009 | Takagi et al. |
| 2009/0133784 A1 | 5/2009 | Kugimiya et al. |

FOREIGN PATENT DOCUMENTS

| | | |
|---|---|---|
| JP | 10-199830 | 7/1998 |
| JP | 11-283934 | 10/1999 |
| JP | 11-284195 | 10/1999 |
| JP | 11-293454 | 10/1999 |
| JP | 11-337976 | 12/1999 |
| JP | 2001-279433 | 10/2001 |
| JP | 2003-273109 | 9/2003 |
| JP | 2004-214606 | 7/2004 |
| JP | 2006-225687 | 8/2006 |
| JP | 2008-127624 | 6/2008 |

OTHER PUBLICATIONS

U.S. Appl. No. 12/414,877, filed Mar. 31, 2009, Takagi, et al.
Office Action issued Jan. 10, 2011, in China Patent Application No. 200910132938.8 (with English translation).
U.S. Appl. No. 13/581,436, filed Aug. 27, 2012, Iwasaki, et al.
Combined Taiwanese Office Action and Search Report issued Aug. 30, 2012 in Patent Application No. 098110738 with English language translation.

* cited by examiner

SEM REFLECTION ELECTRON IMAGE

ANALYZED IMAGE FOR INTERMETALLIC
COMPOUND COMPRISING Al AND Ni

ANALYZED IMAGE FOR INTERMETALLIC
COMPOUND COMPRISING Al, La AND Cu

AL-NI-LA-CU ALLOY SPUTTERING TARGET AND MANUFACTURING METHOD THEREOF

CROSS-REFERENCE TO RELATED APPLICATIONS

This application claims priority from Japanese Patent Application No. 2008-093071 filed on Mar. 31, 2008, the entire subject matter of which is incorporated herein by reference.

BACKGROUND OF THE INVENTION

1. Field of the Invention

The present invention relates to an Al—Ni—La—Cu alloy sputtering target comprising Ni, La and Cu, and a manufacturing method thereof. Specifically, the invention relates to an Al—Ni—La—Cu alloy sputtering target capable of decreasing initial splashing generated in an initial stage of sputtering upon depositing a thin film by using a sputtering target, and a manufacturing method thereof.

2. Description of the Related Art

Al-based alloys have been generally used with a reason of their low electrical resistivity and easy processability in the fields of flat panel displays (FPD) such as liquid crystal displays (LCD), plasma display panels (PDP), electroluminescence displays (ELD), field emission displays (FED) and micro electro mechanical system (MEMS) displays, touch panels, electronic paper and the like, and have been utilized as materials for interconnection films, electrode films, reflection electrode films and the like.

For example, an active matrix type liquid crystal display has a thin film transistor (TFT) as a switching device, a pixel electrode comprising a conductive oxide film, and a TFT substrate having interconnections including scanning lines and signal lines. For interconnection materials constituting the scanning lines and the signal lines, thin films of pure Al or Al—Nd alloy have generally been used. However, in a case where various kinds of electrodes formed by such thin films are in direct contact with pixel electrodes, since insulating aluminum oxides or the like are formed at their interface to increase electrical contact resistance, a barrier metal layer comprising a metal having a high melting point such as Mo, Cr, Ti or W is interposed between the interconnection material of Al and the pixel electrode for decreasing the electrical contact resistance.

However, the method of interposing the barrier metal layer as described above involves a problem of complicating manufacturing steps to increase the production cost.

Then, for providing a technique capable of direct contact between a conductive oxide film constituting a pixel electrode and a interconnection material not by way of a barrier metal layer (direct contact technique), a method of using a thin film of Al—Ni alloys, or Al—Ni alloys that further contain a rare earth element such as Nd or Y has been proposed (JP-A-2004-214606). By using the Al—Ni alloy, since Ni-containing conductive precipitates or the like are formed at the interface to suppress the formation of insulating aluminum oxides or the like, the electrical contact resistance can be kept lower. Further, in a case of using the Al—Ni-rare earth element alloys, heat resistance is further enhanced.

By the way, for forming an Al-based alloy film, a sputtering method of using a sputtering target has been adopted generally. The sputtering method is a method of forming plasma discharge between a substrate and a sputtering target made of a material identical with the thin film material, colliding a gas ionized by the plasma discharge against the sputtering target thereby ejecting atoms of the sputtering target, and depositing them on the substrate to prepare a thin film. Different from a vacuum vapor deposition method, the sputtering method has an advantage capable of forming a thin film of a composition identical with that of a sputtering target. Particularly, since an alloy element such as Nd which is not dissolved in an equilibrium can dissolve in the Al-based alloy film formed by the sputtering method and the Al-based alloy film provides an excellent performance as a thin film, this is an industrially effective method of preparing a thin film and development has been proceeded for the sputtering target as the material therefor.

In recent years, for coping with the increase of the productivity of FPD or the like, the deposition rate during sputtering step has tended to be increased than usual. For increasing the deposition rate, it is most convenient to increase a sputtering power. However, when the sputtering power is increased, since sputtering failure such as splashing (fine molten particles) is generated to result in defects in interconnection films or the like, this gives a drawback such as lowering of the yield and operation performance of FPD.

Then, with an aim of preventing the generation of the splashing, methods described, for example, in JP-A-10-147860, JP-A0-10-199830, JP-A-11-293454 and JP-A-2001-279433 have been proposed. Among them, each of JP-A-10-147860, JP-A-10-199830, and JP-A-11-293454 is based on the view that the splashing is caused by fine voids in the structure of a sputtering target and intends to prevent the generation of the splashing by controlling a dispersion state of compound particles of Al and rare earth element in an Al matrix (JP-A-10-147860), controlling the dispersion state of a compound of Al and a transition element in the Al matrix (JP-A-10-199830), or controlling the dispersion state of an intermetallic compound of an additive element and Al in a sputtering target (JP-A-11-293454). Further, JP-A-2001-279433 discloses a method of suppressing the generation of surface defects accompanying machining by controlling the hardness of a sputtered surface and then performing finishing machining for decreasing arcing (abnormal discharge) that causes the splashing.

On the other hand, a technique of preventing warp of a sputtering target caused by heating during manufacture of a large-scaled sputtering target has been disclosed (JP-A-2006-225687). JP-A-2006-225687 is directed to an Al—Ni-rare earth element alloy sputtering target as an object and proposes a method capable of suppressing the deformation of the sputtering target by causing a compound having an aspect ratio of 2.5 or more and a circle equivalent diameter of 0.2 μm or more to be present with a given number or more along a cross section vertical to the plane of a sputtering target.

SUMMARY OF THE INVENTION

As has been described above, while various techniques have been proposed so far for decreasing the generation of the splashing, thereby improving the sputtering failure, a further improvement has been demanded. Particularly, since the initial splashing generated in the initial stage of sputtering lowers the yield of FPD, this results in a serious problem. However, the technique for preventing the generation of the splashing described in JP-A-10-147860, JP-A-10-199830, JP-A-11-293454, and JP-A-2001-279433 can not effectively prevent the generation of the initial splashing. Further, a technique capable of overcoming the problems described above in the Al-based alloy sputtering target used for forming the Al—Ni—La—Cu alloy film, which is useful, among the Al-based alloy, as a interconnection material that can be in direct contact with a conductive oxide film constituting a pixel electrode and, further, applicable as a interconnection material that can be in direct contact with a semiconductor layer of a thin film transistor, has not yet been proposed.

The invention has been achieved in view of the foregoing situations and it intends to provide a technique capable of decreasing the splashing, particularly, the initial splashing generated upon depositing a thin film by using an Al—Ni—La—Cu alloy sputtering target comprising Ni, La, and Cu.

The features of the invention are as described below.

[1] An Al—Ni—La—Cu alloy sputtering target comprising Ni, La, and Cu, which comprises an Al—Ni intermetallic compound mainly comprising Al and Ni and an Al—La—Cu intermetallic compound mainly comprising Al, La and Cu, in which (1) a total area of an Al—Ni intermetallic compound which has an average grain size of 0.3 μm or more and 3 μm or less is 70% or more by area ratio based on an entire area of the Al—Ni intermetallic compound, and (2) a total area of an Al—La—Cu intermetallic compound which has an average grain size of 0.2 μm or more and 2 μm or less is 70% or more by area ratio based on an entire area of the Al—La—Cu intermetallic compound, in a case where a portion of the sputtering target is observed within a region of from ¼t to ¾t along a cross section vertical to a plane of the sputtering target by using a scanning electron microscope at a magnification of 2000, wherein t represents a thickness of the sputtering target in a direction vertical to a plane of the sputtering target.

[2] The Al—Ni—La—Cu alloy sputtering target according to [1], which comprises:

Ni in an amount of 0.05 atomic % or more and 5 atomic % or less;

La in an amount of 0.10 atomic % or more and 1 atomic % or less; and

Cu in an amount of 0.10 atomic % or more and 2 atomic % or less.

[3] A method of manufacturing the Al—Ni—La—Cu alloy sputtering target according to [1] or [2], which includes in this order:

obtaining a molten metal at 850 to 1000° C. of an Al—Ni—La—Cu alloy comprising Ni in an amount of 0.05 atomic % or more and 5 atomic % or less, La in an amount of 0.10 atomic % or more and 1 atomic % or less and Cu in an amount of 0.10 atomic % or more and 2 atomic % or less;

gas-atomizing the molten metal of the Al-based alloy at a gas/metal ratio of 6 Nm$^3$/kg or more to refine the Al-based alloy;

depositing the refined Al-based alloy on a collector under a condition of a spray distance of from 900 to 1200 mm to obtain a preform of the Al-based alloy;

densifying the preform of the Al-based alloy by a densifying means to obtain a dense body of the Al-based alloy;

subjecting the dense body of the Al-based alloy to plastic working to obtain a plastic worked body of the Al-based alloy; and subjecting the plastic worked body of the Al-based alloy to heat treatment or annealing.

In the Al—Ni—La—Cu alloy sputtering target of the invention, since the grain size distribution of intermetallic compounds (Al—Ni intermetallic compound mainly comprising Al and Ni, and Al—La—Cu intermetallic compound mainly comprising Al, La, and Cu) present in the sputtering target is properly controlled, generation of the splashing, particularly, generation of the initial splash can be suppressed and sputtering failure can be suppressed effectively.

EXPLANATION OF REFERENCE

Figure 1A:
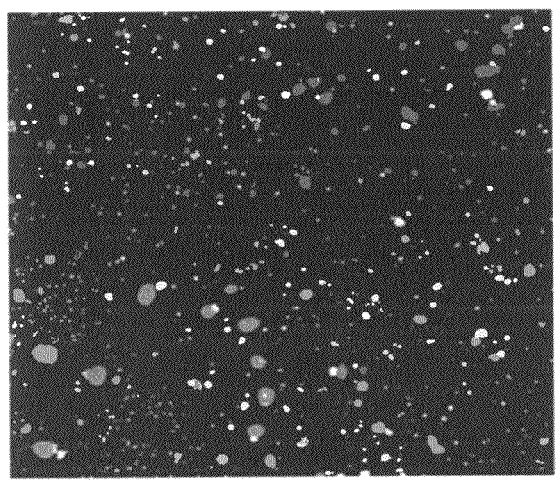
FIG. 1A shows an SEM reflection electron image of No. 5 in Table 1.

1 Induction melting furnace
2 Molten metal of Al-based alloy
3a, 3b Gas atomizer
4a, 4b Gas hole of bobbin
5 Collector
6 Nozzle
6a, 6b Center axis of gas atomizer nozzle
A Spray axis
A1 End of nozzle 6
A2 Center of collector 5
A3 Intersection between horizontal line of center A2 of collector 5 and spray axis A
5 L Spray distance
α Exit angle of gas atomizer
β Collector angle

DETAILED DESCRIPTION OF THE INVENTION

The present inventors have made an earnest study for providing an Al-based alloy sputtering target capable of decreasing splash generated during sputtering deposition, particularly, initial splashing generated in the initial stage during sputtering deposition.

As a result, it has been found that any of grain size distributions of intermetallic compounds contained in an Al—Ni—La alloy sputtering target (Al—Ni intermetallic compound mainly comprising Al and Ni, and Al—La intermetallic compound mainly comprising Al and La) has a meaningful correlation with the generation of the initial splashing and, accordingly, an aimed object can be attained by properly controlling the grain size distribution of the intermetallic compounds (refer to Japanese Patent Application No. 2006-313506). Hereinafter, the invention described above may be sometimes referred to as an Al—Ni—La alloy sputtering target of the related art.

The present inventors have further made studies on the Al—Ni—La alloy sputtering target. Specifically, on an Al—Ni—La—Cu alloy sputtering target with further addition of Cu to the Al—Ni—La alloy sputtering target described above, when the intermetallic compounds contained in this sputtering target have been studied in details, it has been found that any of the grain size distributions for the intermetallic compounds (Al—Ni binary intermetallic compound mainly comprising Al and Ni and Al—La—Cu ternary intermetallic compound mainly comprising Al, La, and Cu) has a meaningful correlation with the generation of the initial splashing and, accordingly, that an aimed object can be attained by properly controlling the grain size distribution of the intermetallic compound, thereby accomplishing the invention.

Figure 2A:
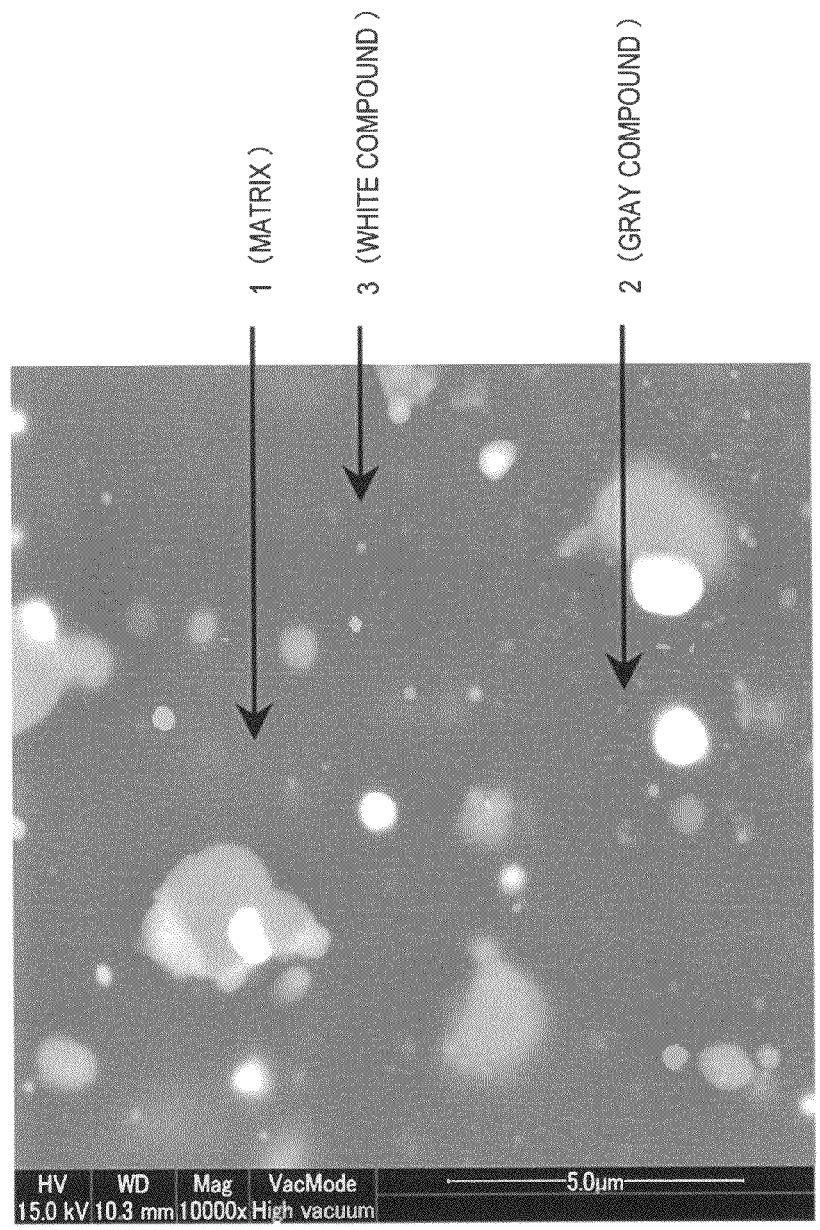
FIG. 2A shows an SEM reflection electron image of No. 5 in Table 1.
Figure 2B:
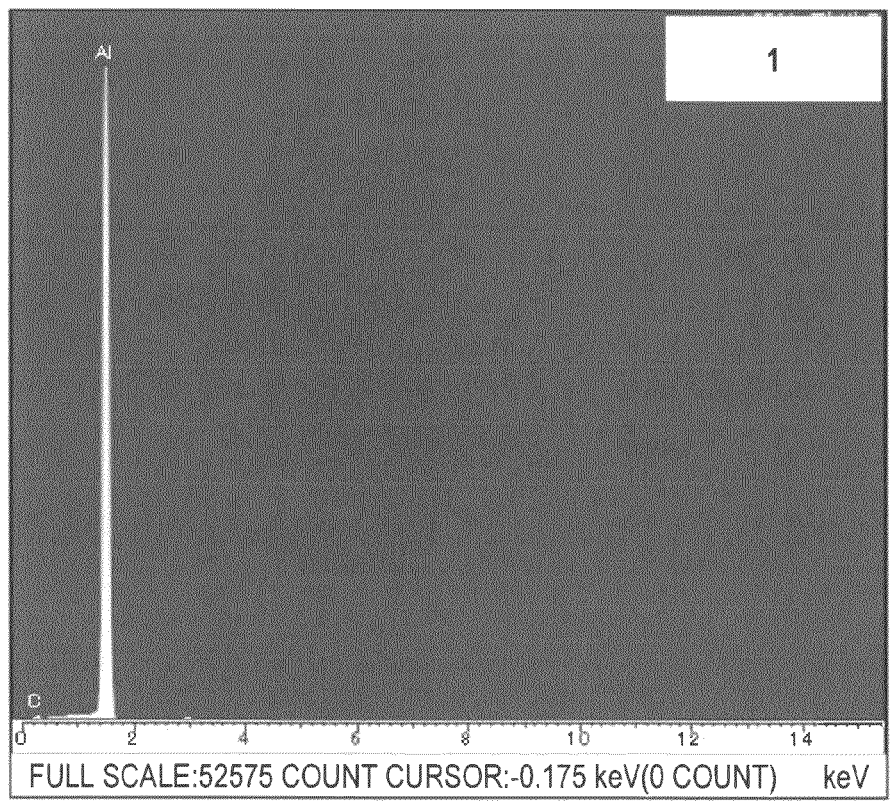
FIG. 2B is a view showing a result of EDX analysis for the composition of 1 (matrix) in FIG. 2A.
Figure 2C:
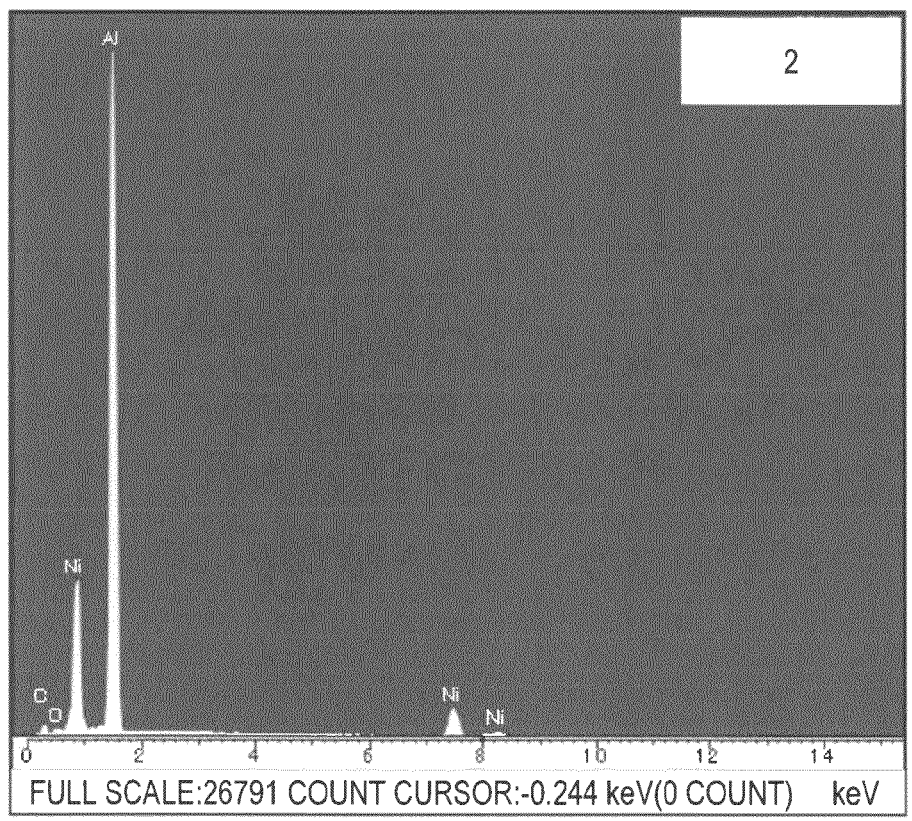
FIG. 2C is a view showing a result of EDX analysis for the composition of 2 (gray compound) in FIG. 2A.

In the present specification, "Al—Ni intermetallic compound mainly comprising Al and Ni" means such a compound that peaks for Al and Ni are detected intensely as shown in FIG. 2C to be described later and peaks for other elements than them are not detected substantially when analyzing the sputtering target by a scanning electrode microscope (SEM) having an Energy Dispersive X-ray Fluorescence Spectrometer (EDX) by a method to be detailed below. Typical Al—Ni intermetallic compounds include binary intermetallic compounds such as $Al_3Ni$.

Figure 2D:
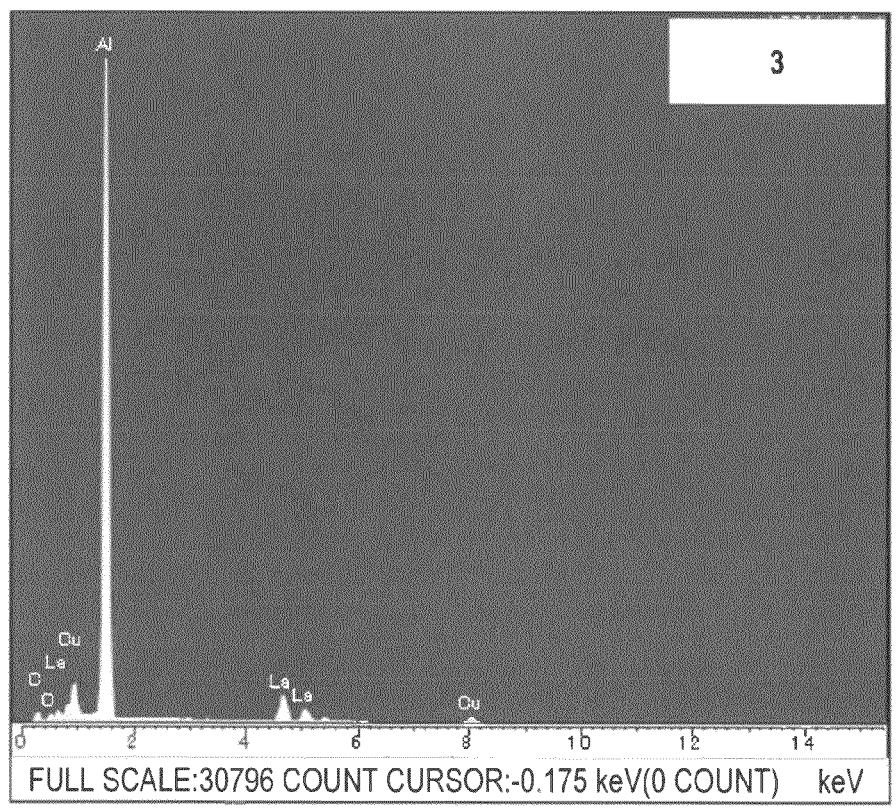
FIG. 2D is a view showing a result of EDX analysis for the composition of 3 (white compound) in FIG. 2A.

Further, "Al—La—Cu intermetallic compound mainly comprising Al, La, and Cu" means a compound in which peaks for Al, La, and Cu are detected intensely and peaks for elements other than them are not detected substantially as shown in FIG. 2D to be described later when analyzing the sputtering target by the same method as described above. Typical Al—La—Cu intermetallic compounds include ternary intermetallic compounds such as $Al_7La_2Cu$.

Further, in the specification, "capable of preventing (decreasing) generation of the initial splashing" means that an average value for the splashing generated upon sputtering under the condition shown in the example to be described later (sputtering time: 81 sec) is less than 8 Number/cm$^2$. As described above, in the invention, the sputtering time is defined as 81 sec and the splashing is evaluated in the initial stage of the sputtering deposition and, in this regard, the evaluation standards are different from those of the techniques of JP-A-10-147860, JP-A-10-199830, JP-A-11-293454 and JP-A-2001-279433 described above in which generation of the splashing in the initial stage is not evaluated.

At first, description is to be made to the Al—Ni—La—Cu alloy as an object of the invention.

The Al-based alloy sputtering target of the invention contains Ni, La, and Cu in Al as a matrix. The reasons of selecting the alloy materials are as described below.

In the Al-based alloy film formed by using the Al—Ni—La—Cu alloy sputtering target, the effect of lowering the electrical contact resistance with the pixel electrode to be in direct contact with the Al-based alloy film can be obtained by incorporating Ni thereinto. Further, an effect of improving the heat resistance of the Al-based alloy film can be obtained by incorporating La thereinto. Further, an effect of improving the corrosion resistance of the Al-based alloy film can be obtained by incorporating Cu thereinto.

Referring to the Al—Ni-rare earth element alloy sputtering target, while JP-A-2006-225687 also discloses a technique directed to the sputtering target of the composition described above as a target, this is not directed to the Al—Ni—La—Cu alloy sputtering target containing La as the rare earth element as in the invention. Naturally, JP-A-2006-225687 has no technical idea of the invention of controlling the grain size distribution of the given intermetallic compound for preventing generation of the initial splashing in the Al—Ni—La—Cu alloy sputtering target as an object of the invention. Further, the compound (intermetallic compound) defined in JP-A-2006-225687 is a disk-like compound with an aspect ratio of 2.5 or more and a circle-equivalent diameter of 0.2 μm or more, and the shape of the intermetallic compound is different from that of the invention having a spherical compound. Further, the manufacturing method is also different between them. As will be described specifically later, an Al-based alloy preform is manufactured preferably by a spray forming method also in the invention like in JP-A-2006-225687. However, while a given disk-like compound is ensured by, particularly controlling the nozzle diameter φ to 2.5 to 10 mm and a gas pressure to 0.3 to 1.5 MPa in JP-A-2006-225687, a desired grain size distribution is ensured by particularly controlling a gas/metal ratio to 6 Nm$^3$/kg or more in the invention. Since the gas/metal ratio is not considered at all in JP-A-2006-225687, the Al—Ni—La—Cu alloy sputtering target of the invention can not be manufactured even when it is based on the manufacturing method disclosed in JP-A-2006-225687.

Further, as the technique of suppressing the generation of the splashing of the Al-based alloy sputtering target, techniques of controlling the dispersion state of compounds or intermetallic compounds of Al and rare earth elements in the Al matrix have been disclosed, for example, as in JP-A-2004-214606, JP-A-10-147860, JP-A-10-199830, and JP-A-11-293454, in addition to JP-A-2006-225687. However, none of them specifically discloses the Al—Ni—La—Cu alloy sputtering target as an object of the invention. None of the patent documents, including the foregoing patent documents, discloses the Al-based alloy containing La as the rare earth element and containing Cu as in the invention.

As will be described later specifically, the invention has been achieved based on the novel finding that the shape of the intermetallic compound is different greatly between the Al—Ni—La—Cu alloy sputtering target in which La and Cu are contained in the Al—Ni alloy and the Al—Ni-rare earth element alloy sputtering target in which the rare earth element other than La is contained in the Al—Ni-based alloy (for example, Al—Ni—Nd alloy sputtering target disclosed in JP-A-2006-225687). In the Al—Ni—La—Cu alloy sputtering target of the invention, a binary intermetallic compound comprising Al and Ni and a ternary intermetallic compound comprising Al, La, and Cu are present but a ternary intermetallic compound comprising Al, Ni, and La is not substantially present as shown in FIGS. 2A to 2D described previously. On the contrary, in the Al—Ni—Nd alloy sputtering target described in JP-A-2006-225687, a ternary intermetallic compound comprising Al, Ni, and Nd is mainly present but a binary intermetallic compound comprising Al and Ni is scarcely present. The technique of the invention is positioned as a technique specialized particularly to the Al—Ni—La—Cu alloy sputtering target among the Al—Ni-rare earth element alloy sputtering targets.

The amount of Ni contained in the Al-based alloy of the invention is preferably within a range of 0.05 atomic % or more and 5 atomic % or less. The range is determined while considering the result of the experiment using "Al—Ni—La alloy sputtering target of the related art" described above. In a case where the lower limit of the Ni amount is less than 0.05 atomic %, since the area ratio occupied by the intermetallic compound of less than 0.3 μm is increased, the intermetallic compound is detached upon machining the surface of the sputtering target and the uneven surface area is increased, the number of the initial splashing increases. On the other hand, in a case where the upper limit of the Ni amount exceeds 5 atomic %, since the area ratio occupied by the intermetallic compound of larger than 3 μm is increased and the surface unevenness is increased upon machining the surface of the sputtering target to involve more non-conductive inclusions such as oxides, the number of the initial splashing is increased. The content of Ni is preferably 0.1 atomic % or more and 4 atomic % or less and more preferably 0.2 atomic % or more and 3 atomic % or less.

Further, the amount of La contained in the Al-based alloy of the invention is preferably within a range of 0.10 atomic % or more and 1 atomic % or less. The range is determined while considering the result of the experiment by using "Al—Ni—La alloy sputtering target of the related art" described above. In a case where the lower limit of the La amount is less than 0.10 atomic %, since the area ratio occupied by the intermetallic compound of less than 0.2 µm is increased and the intermetallic compound is detached upon machining the surface of the sputtering target to increase the uneven surface area, the number of the initial splashing increases. On the other hand, in a case where the upper limit of the La amount exceeds 1 atomic %, since the area ratio occupied by the intermetallic compound is larger than 2 µm is increased and the surface unevenness is increased upon machining the surface of the sputtering target to involve more non-conductive inclusions such as oxides, the number of the initial splashing is increased. The content of La is preferably 0.15 atomic % or more and 0.8 atomic % or less and more preferably 0.2 atomic % or more and 0.6 atomic % or less.

The content of Cu is preferably within a range from 0.10 atomic % or more and 2 atomic % or less. The range is calculated based on the result of the experiment of the example to be described later. In a case where the lower limit of the Cu amount is less than 0.10 atomic %, since the area ratio occupied by the intermetallic compound of less than 0.2 µm is increased and the intermetallic compound is detached upon machining the surface of the sputtering target to increase the uneven surface area, the number of the initial splashing is increased. On the other hand, in a case where the upper limit of the Cu amount is more than 2 atomic %, since the area ratio occupied by the intermetallic compound of larger than 2 µm is increased to involve more non-conductive inclusions such as oxides and the surface unevenness is increased upon machining the surface of the sputtering target, the number of the initial splashing is increased. The Cu content is more preferably 0.10 atomic % or more and 1 atomic % or less.

The Al-based alloy used in the invention contains Ni, La, and Cu as described above and a reminder contains Al and inevitable impurities. The inevitable impurities include those elements, for example, Fe, Si, C, O and N intruding inevitably in the manufacturing process. The content is preferably controlled to be 0.05 wt. % or less of Fe, 0.05 wt. % or less of Si, 0.05 wt. % or less of C, 0.05 wt. % or less of O and 0.05 wt. % or less of N.

Then, the intermetallic compound that constitutes the feature of invention is to be described.

In the sputtering target of the invention, the following intermetallic compounds present in the sputtering target satisfy the following conditions (1) and (2).

(1) For the Al—Ni intermetallic compound mainly comprising Al and Ni, a total area of an Al—Ni intermetallic compound which has an average grain size within a range from 0.3 µm or more and 3 µm or less is 70% or more by area ratio based on an entire area of the Al—Ni intermetallic compound.

(2) For the Al—La—Cu intermetallic compound mainly comprising Al, La and Cu, a total area of an Al—La—Cu intermetallic compound which has an average grain size within a range from 0.2 µm or more and 2 µm or less is 70% or more by area ratio based on an entire area of the Al—La—Cu intermetallic compound.

As described above, in the Al—Ni—La—Cu alloy sputtering target as an object of the invention, when the intermetallic compound in the SEM backscattered electron image is subjected to image analysis by the measuring method to be described below specifically, the main intermetallic compounds that can be observed are the Al—Ni binary intermetallic compound and the Al—La—Cu ternary intermetallic compound as described above, and the Al—Ni—La ternary intermetallic compound analogous to the Al—Ni—Nd ternary intermetallic compound which is found when observing the Al—Ni—Nd alloy sputtering target used typically so far with the same manner is not substantially present (refer to FIGS. 2A to 2D described above).

Then, the invention is based on the result of the experiment for each of the intermetallic compounds that generation of the initial splashing can be prevented effectively in a case where the area ratio (occupation ratio) of the intermetallic compound with the average grain size being within a given range is increased, and the occupation ratio of such intermetallic compounds is defined as high as possible (70% or more in the invention).

The mechanism for preventing the generation of the splashing by the intermetallic compound described above is estimated as described below.

It is considered that the generation of the initial splashing is caused generally by the detaching of the intermetallic compound upon machining the surface of the sputtering target, and this increases the uneven surface area. Then, (1) referring to the Al—Ni intermetallic compound mainly comprising Al and Ni, it is considered that as the area ratio occupied by the intermetallic compound with an average grain size of less than 0.3 µm is increased, the number of the generation of the initial splashing is increased and, on the other hand, as the area ratio occupied by the intermetallic compound with an average grain size of larger than 3 µm is increased, the non-conductive inclusions such as oxides is involved more due to the increase of the surface unevenness by machining and, as a result, the number of generation of the initial splashing is increased. Such a trend is also found (2) regarding the Al—La—Cu intermetallic compound mainly comprising Al, La, and Cu. As the area ratio occupied by the intermetallic compound with the average grain size of less than 0.2 µm is increased, the number of the generation of the initial splashing is increased and, on the other hand, as the area ratio occupied by the intermetallic compound with the average grain size of larger than 2 µm is increased, non-conductive inclusions such as oxides are involved more due to increase of the surface unevenness by machining and, as a result, the number of the generation of the initial splashing is increased.

It is estimated that the range of the average grain size of the intermetallic compound that contributes to the prevention for the generation of the initial splashing differs somewhat between the Al—Ni intermetallic compound and the Al—La—Cu intermetallic compound because the interface strengths are different between these intermetallic compounds and the Al matrix. That is, the interface strength between the Al—La—Cu intermetallic compound and the Al matrix is larger compared with the interface strength between the Al—Ni intermetallic compound and the Al matrix.

In the invention, the occupation ratio of the intermetallic compound having the average grain size that satisfies the range described above is 70% or more by area ratio. Larger occupation ratio is more preferred. For example, it is preferably 75% or more and more preferably 80% or more for any of intermetallic compounds.

The method of measuring the grain size distribution of the intermetallic compound as an object of the invention is as described below.

At first, an Al—Ni—La—Cu alloy sputtering target containing Ni, La, and Cu is prepared.

The surface to be measured of the sputtering target (at arbitrary three points within a region of from ¼t to ¾t (t: thickness) along the cross section in the direction vertical to the plane (normal direction to the rolling surface: ND)) was observed by using SEM (using Quanta 200FEG manufactured by Philips Co., Ltd. or Supra-35 manufactured by Carl Zeiss Co., Ltd. in the examples to be described later) having EDX at a magnification of 2000 to photograph a reflection electron image. The surface to be measured is previously mirror polished. 1 view field size is about 60 μm×50 μm. The reflection electron image photographed is subjected to image analysis to determine the average grain size (circle-equivalent diameter) of the Al—Ni intermetallic compound and the Al—La—Cu intermetallic compound and the area ratio occupied by the intermetallic compound of the average grain size in the entire intermetallic compound by using an analysis apparatus (NanoHunter NS2K-Pro, manufactured by Nanosystem Corporation). As described above, area ratio was determined for three view fields in total and the average value thereof is defined as the area ratio for each of the intermetallic compounds.

According to the measuring method described above, the Al—Ni intermetallic compound and the Al—La—Cu intermetallic compound are easily distinguished by the difference of color tone (density difference). The reflection electron image of the Al—Ni intermetallic compound appears gray and that of the Al—La—Cu intermetallic compound appears white.

Figure 1B:
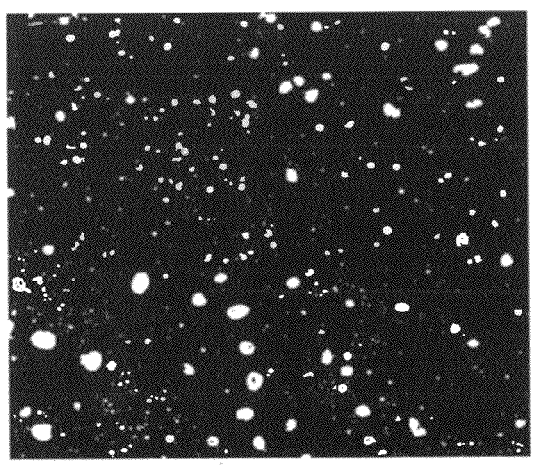
FIG. 1B shows an analyzed image of an Al—Ni intermetallic compound in the SEM reflection electron image.
Figure 1C:
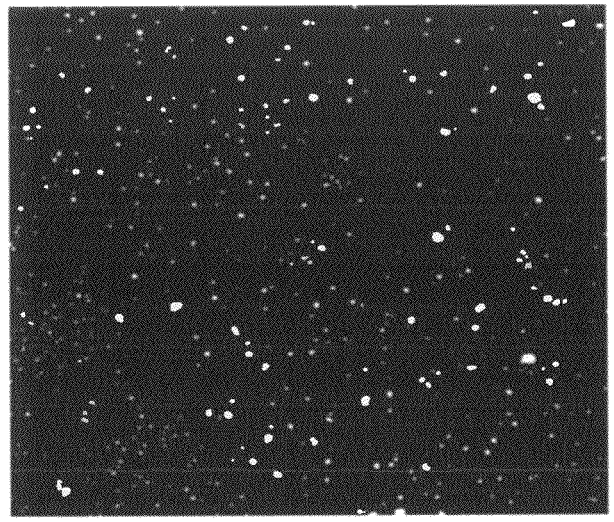
FIG. 1C shows an analyzed image of an Al—La—Cu intermetallic compound in the SEM reflection electron image.

For the reference, an SEM reflection electron image (FIG. 1A), an image of the Al—Ni intermetallic compound (FIG. 1B), and an image of the Al—La—Cu intermetallic compound (FIG. 1C) obtained by the method described above are shown for No. 5 in Table 1 shown in the example to be described below in FIGS. 1A to 1C. As shown in FIG. 1A, the reflection electron image of the Al—La—Cu intermetallic compound appears white compared with the Al—Ni intermetallic compound.

Further, FIGS. 2B to 2D show the result of EDX analysis for the compositions of a matrix (1 in FIG. 2A), a gray compound (2 in FIG. 2A) and a white compound (3 in FIG. 2A) respectively for No. 5 identical with that described above. It was confirmed that the matrix 1 consists substantially of Al as shown in FIG. 2B, the gray compound 2 consists substantially of Al and Ni as shown in FIG. 2C, and the white compound 3 is substantially consists of Al, La, and Cu as shown in FIG. 2D.

Then, a method of manufacturing a sputtering target of the invention is to be described.

At first, a molten metal of an Al—Ni—La—Cu alloy containing 0.05 atomic % or more and 5 atomic % or less of Ni, 0.10 atomic % or more and 1 atomic % or less of La, and 0.10 atomic % or more and 2 atomic % or less of Cu is prepared.

Then, by using the Al-based alloy described above, after manufacturing a preform of the Al-based alloy (intermediate body before obtaining a final dense body) by a spray forming method, the preform is preferably densified by densifying means.

The spray forming method is a method of atomizing various kinds of molten metals by a gas, depositing particles quenched to a semi-molten state, a semi-solidification state, and a solid state, and obtaining a base material (preform) of a given shape. The method provides an advantage, for example, capable of obtaining, in a single step, a large sized preform which is difficult to obtain, for example, by a melt casting method or a powder sintering method, as well as capable of finely refining crystal grains and uniformly dispersing the alloy elements.

The manufacturing step for the preform includes a step of obtaining a molten metal of an Al-based alloy by melting generally within a range from (liquid phase temperature +150° C.) to (liquid phase temperature +300° C.), a step of refining the molten metal of the Al-based alloy by gas-atomizing under the condition at a gas/metal ratio represented by the ratio of gas flowing amount/molten metal flowing amount of 6 Nm$^3$/kg or more, and a step of depositing the refined Al-based alloy on a collector under the condition at a spray distance of about 900 to 1200 mm, thereby obtaining a preform.

Figure 3:
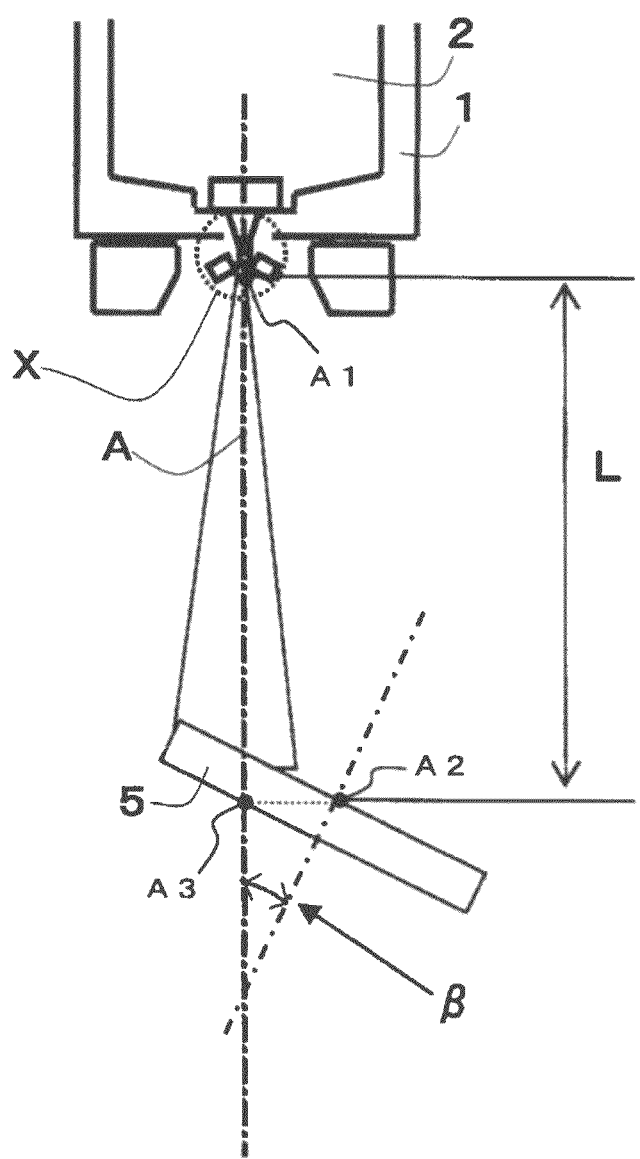
FIG. 3 is a cross sectional view partially showing an example of an apparatus used for manufacturing a preform.
Figure 4:
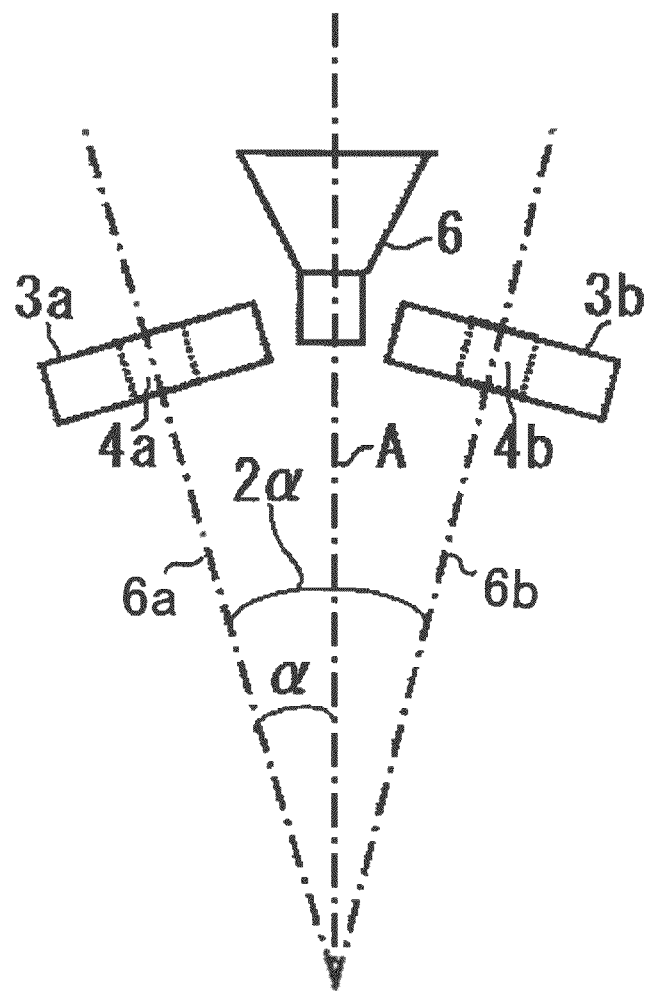
FIG. 4 is an enlarged view for a main portion X in FIG. 3.

Each of the steps for obtaining the preform is to be described specifically with reference to FIG. 3 and FIG. 4.

FIG. 3 is a fragmentary cross sectional view for an example of an apparatus used for manufacturing the preform of the invention. FIG. 4 is an enlarged view for a main portion X in FIG. 3.

The apparatus shown in FIG. 3 has an induction melting furnace 1 for melting an Al-based alloy, gas atomizers 3a and 3b disposed below the induction melting furnace 1 respectively, and a collector 5 for depositing the preform. The induction melting furnace 1 has a nozzle 6 for dropping the molten metal 2 of the Al-based alloy. Further, the gas atomizers 3a and 3b have gas holes 4a and 4b of bobbins respectively for atomizing the gas. The collector 5 has driving means such as a stepping motor (not illustrated) for lowering the collector 5 such that the height for the preform deposition surfaces is constant even when manufacture of the preform proceeds.

At first, the Al-based alloy of the composition described above is prepared. After adding the Al-based alloy into the induction melting furnace 1, it is melted, preferably, in an inert gas atmosphere (for example, Ar gas) at a temperature within a range of about +150° C. to +300° C. relative to the liquid phase temperature of the Al-based alloy.

While the melting temperature is generally set within a range of the liquid phase temperature from +50° C. to 200° C. (for example, refer to JP-A-9-248665), the melting temperature is set to the range described above in the invention for properly controlling the grain size distribution of the two kinds of the intermetallic compounds described above. In the case of the Al—Ni—La—Cu alloy as an object of the invention, melting is generally performed at a temperature of from 850 to 1000° C. In a case where the melting temperature is lower than 850° C., nozzles is clogged in the spray forming. On the other hand, in a case where the temperature exceeds 1000° C., since the temperature of the droplet increases, the area ratio occupied by the Al—Ni intermetallic compound with an average grain size of 3 μm or more is increased, and a desired effect of decreasing the splashing can not be obtained (refer to examples to be described later). The melting temperature of the alloy is preferably within a range from (liquid phase temperature +150° C.) to (liquid phase temperature +300° C.). In a case of the Al—Ni—La—Cu alloy as an object of the invention, it is preferably from 850 to 1000° C. and more preferably from 900 to 1000° C.

The molten metal 2 of the alloy obtained as described above is dropped by way of the nozzle 6 into a chamber (not illustrated) in an inert gas atmosphere. In the chamber, an inert gas jet stream at a high pressure is blown from the gas holes 4a and 4b of the bobbins disposed to the gas atomizers 3a and 3b to the molten metal 2 of the alloy, by which the molten metal of the alloy is refined.

Gas atomizing is preferably performed by using an inert gas or a nitrogen gas, by which oxidation of the molten metal is suppressed. The inert gas includes, for example, an argon gas.

In this case, the gas/metal ratio is set to 6 $Nm^3$/kg or more. The gas/metal ratio is represented by the ratio of gas flowing amount ($Nm^3$)/molten metal flowing amount (kg). In the present specification, the gas flowing amount means a total amount of a gas flowed from the gas holes 4a and 4b of the bobbins for gas-atomizing the molten metal of the Al-based alloy (amount used finally). Further, in the specification, the molten metal flowing amount means a total amount of the molten metal flowed from the flow port of the molten metal (nozzle 6) of a vessel containing the molten metal of the Al-based alloy (induction melting furnace 1).

In a case where the gas/metal ratio is less than 6 $Nm^3$/kg, since the size of the droplet tends to increase, the cooling rate is lowered and the occupation ratio of the Al—Ni intermetallic compound with the average grain size of more than 3 µm is increased, no desired effect can be obtained (refer to examples to be described later).

A higher gas/metal ratio is more preferred. For example, it is preferably 6.5 $Nm^3$/kg or more and more preferably 7 $Nm^3$/kg or more. While the upper limit is not particularly restricted, it is preferably 15 $Nm^3$/kg and more preferably 10 $Nm^3$/kg while considering the stability of the flow of droplet upon gas atomizing and the cost.

Further, assuming the angle formed between the opposed central axes 6a and 6b for the gas atomizer nozzle as $2\alpha$, $\alpha$ is preferably controlled within a range from 1 to 10°. The angle $2\alpha$ formed between the opposed central axes 6a and 6b for the gas atomizing nozzle means a total angle for respective inclination $\alpha$ of the gas atomizers 4a and 4b relative to the line when the molten metal 2 drops just vertically below, as shown in FIG. 4 (corresponding to spray axis A). Hereinafter, $\alpha$ is referred to as "exit angle $\alpha$ of gas atomizing". The exit angle for gas atomizing $\alpha$ is more preferably 1° or more and 7° or less.

Then, the Al-based alloy refined as described above (droplet) is deposited on the collector 5 to obtain a preform.

In this case, the spray distance is preferably controlled within a range from 900 to 1200 mm. The spray distance defines the accumulation position for the droplets and means a distance L from the end of the nozzle 6 (A1 in FIG. 3) to the center of the collector 5 (A2 in FIG. 3). As will be described later, since the collector 5 is slanted at a collector angle $\beta$, the spray distance L means, strictly, a distance between the end of the nozzle 6 and a point where the horizontal line for the center A2 of the collector 5 intersects the spray axis A (A3 in FIG. 3). The spray axis A defines a direction along which the droplet of the Al-based alloy drops just vertically below for the convenience of explanation.

Generally, while the spray distance in the spray forming is often controlled to about 500 mm, this is defined within the range described above in this invention for obtaining a desired grain size distribution for the two kinds of the intermetallic compounds (refer to examples to be described later). In a case where the distance is less than 900 mm, since the droplet at a high temperature is deposited on the collector to lower the cooling rate and the occupation ratio of the Al—Ni intermetallic compound with the average grain size of 3 µm or more is increased, no desired effect can be obtained. On the other hand, in a case where the spray distance is more than 1200 mm, the yield is lowered. The spray distance L is more preferably within a range from 950 to 1100 mm.

Further, the collector angle $\beta$ is preferably controlled within a range from 20 to 45°. As shown in FIG. 3, the collector angle $\beta$ means the inclination of the collector 5 relative to the spray axis A.

A preferred method for obtaining the preform has been described above.

A sputtering target may be manufactured by a customary method of densifying the thus obtained preform of the Al-based alloy by densifying means to obtain a dense body and then subjecting the dense body to a plastic working.

At first, a dense body of the Al-based alloy is obtained by performing the densifying means to the preform described above. As the densifying means, it is preferred to perform a method of pressurizing the preform substantially in an isotropic direction, particularly, performing hot isostatic pressing (HIP) in which pressurizing is performed in a hot state. Specifically, the HIP treatment is performed preferably under the pressure of 80 MPa or higher and more preferably 90 MPa or higher, and at a temperature of from 400 to 600° C. and more preferably from 500 to 570° C. The time for the HIP treatment is preferably within a range about from 1 to 10 hours and more preferably 1.5 to 5 hours.

Then, a plastic working is performed to the dense body of the Al-based alloy to obtain a plastic worked body of the Al-based alloy. Specifically, it is preferred to obtain a slab by forging the dense body of the Al-based alloy. The forging conditions are not particularly restricted so long as a method employed usually for the manufacture of sputtering targets is used and, for example, forging is preferably performed after heating the dense body of the Al-based alloy before forging at about 500° C. and more preferably 480 to 500° C., for about 1 to 3 hours and more preferably 1.5 to 2.5 hours.

Rolling is performed to the slab obtained as described above under the conditions at a rolling temperature of 300 to 550° C. and more preferably 350 to 500° C., and at a total reduction ratio of 40 to 90% and more preferably 50 to 80%. As shown in the example to be described below, it is necessary in the invention to strictly control the rolling conditions as described above and, in a case where rolling is performed under the conditions in which even one of them is out of the range as described above, no desired crystal structure can be obtained.

The total reduction ratio is represented by the following formula:

Total reduction ratio (%)={(thickness before starting rolling)−(thickness after completing rolling)}/ (thickness before starting rolling)×100

Since the Al-based alloy manufactured by the spray forming method less changes the structure during working, it can be manufactured either by cold rolling or hot rolling. However, since it is effective for increasing the working ratio per 1 pass to heat the Al-based alloy material and perform working in a temperature region where the deformation resistance is low as described above, hot rolling is used preferably.

Then, heating (heat treatment or annealing) is performed at a temperature of 250 to 500° C. and more preferably 250 to 400° C., and for 0.5 to 4 hours and more preferably 1.5 to 3.5 hours. The atmosphere during the heating treatment is not particularly restricted and it can be performed in any atmosphere, that is, in the air, in an inert gas or in vacuum, but heating in the air is preferred in view of the productivity and the cost.

After the heating treatment, when machining is performed to a given shape, a desired sputtering target is obtained.

The Al—Ni—La—Cu alloy sputtering target of the invention is suitably used particularly for the manufacture of interconnection materials of an Al—Ni—La—Cu alloy film that can be in direct contact with a conductive oxide film that constitutes a pixel electrode, or interconnection materials of an Al—Ni—La—Cu alloy film that can be in direct contact with the semiconductor layer of thin film transistors.

EXAMPLE

The invention is to be described more specifically with reference to examples but the invention is not restricted to the following examples and can be practiced with appropriate modifications in a range capable of adaptable to the gist of the invention and all of them are contained within the technical range of the invention.

Example 1

Using the Al-based alloys of various compositions shown in Tables 1 and 2, performs of the Al-based alloy (density: about 50 to 60%) were obtained by the following spray forming method.

| (Spray forming conditions) | |
|---|---|
| Melting temperature: | 800 to 1100° C. |
| Gas/metal ratio: | 5 to 8 Nm³/kg |
| Spray distance: | 800 to 1300 mm |
| Exit angle α of gas atomizer (refer to FIG. 4): | 7° |
| Collector angle β: | 35° |

The thus obtained preform was encapsulated and degassed in a capsule and a hot isostatic pressing (HIP) was performed to the entire capsule to obtain a dense body of the Al—Ni—La—Cu alloy. The HIP treatment was performed at an HIP temperature of 550° C., at an HIP pressure of 85 MPa, and for an HIP time of 2 hours.

Then, after forging the obtained dense body into a plate-like metal material and, further, rolling the same such that the plate thickness was mostly identical with that of the final product (sputtering target), it was subjected to heat treatment or annealing and machining (cutting and lathing working) to manufacture a disk-like Al-(0.02 to 6.0 atomic %) Ni-(0.05 to 1.5 atomic %) La-(0.05 to 2.5 atomic %) Cu alloy sputtering target (size: 101.6-mm diameter×5.0-mm thickness). Detailed conditions are as shown below.

| Heating condition before forging: | at 500° C. for 2 hours |
|---|---|
| Heating condition before rolling: | at 400° C. for 2 hours |
| Total reduction ratio: | 50% |
| Condition of heat treatment or annealing: | at 250° C. for 2 hours |

Then, by using each of the sputtering targets obtained by the method described above, the number of the splashing (initial splashing) generated upon performing sputtering under the following conditions was measured.

At first, to an Si wafer substrate (size: 100.0-mm diameter× 0.5-mm thickness), DC magnetron sputtering was performed by using a sputtering apparatus of "sputtering system HSR-542S" manufactured by Shimadzu Corporation. The sputtering conditions are as described below.

| Back pressure: | $3.0 \times 10^{-6}$ Torr or less |
|---|---|
| Ar gas pressure: | $2.25 \times 10^{-3}$ Torr |
| Ar gas flow rate: | 30 sccm |
| Sputtering power: | 811 W |
| Distance between a substrate and a sputtering target: | 51.6 mm |
| Substrate temperature: | room temperature |
| Sputtering time: | 81 sec |

As described above, 16 sheets of thin films (total thickness: 0.2 mm) were formed per one piece of a sputtering target. Accordingly, sputtering was performed for 81 (sec)×16 (sheets)=1296 sec.

Then, by using a particle counter (wafer surface inspection apparatus WM-3, manufactured by Topcon Corporation), the positional coordinate, the size (average particle size), and the number of particles observed on the surface of the thin film were measured. In this case, those of a size of 3 μm or more were regarded as particles. Then, the thin film surface was observed by an optical microscope at a magnification of 1000, those of a semi-spherical shape were regarded as the splashing and the number of the splashing per unit area was counted.

Specifically, the step of performing the sputtering described above for one sheet of the thin film was performed continuously for 16 sheets of thin films in the same manner while replacing the Si wafer substrates and the average value for the number of the splashing was defined as "number of generation of initial splashing". In this example, those with the number of generation of the initial splashing of less than 8 Number/cm² obtained as described above were defined as "having effect of decreasing initial splashing: pass (A)", while those of 8 Number/cm² or more were defined as "having no effect of decreasing initial splashing: failed (B)".

Figure 5:
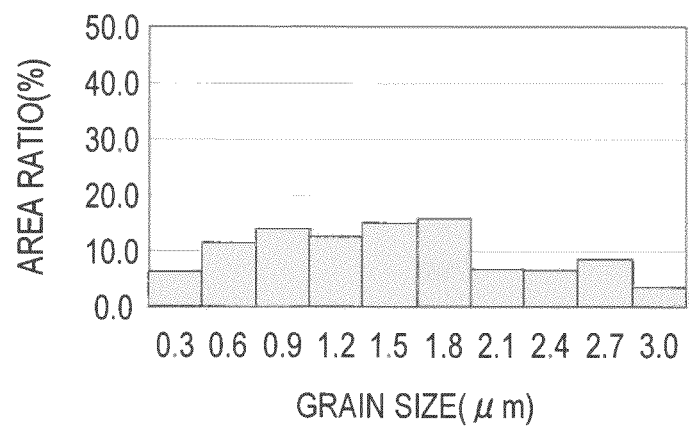
FIG. 5 is a graph showing a grain size distribution of an Al—Ni intermetallic compound for No. 5 in Table 1.
Figure 6:
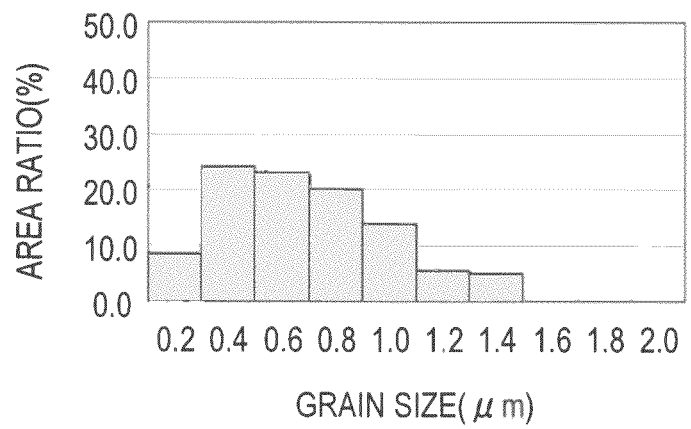
FIG. 6 is a graph showing a grain size distribution of an Al—La—Cu intermetallic compound for No. 5 in Table 1.

The results are shown together in Table 1. For the reference, the grain size distribution of the Al—Ni intermetallic compound is shown in FIG. 5, and the grain size distribution of the Al—La—Cu intermetallic compound is shown in FIG. 6 for No. 5 in Table 1.

TABLE 1

| | | | | | | | Area ratio of intermetallic compound (%) | | Initial splashing | |
|---|---|---|---|---|---|---|---|---|---|---|
| No. | Ni (atomic %) | La (atomic %) | Cu (atomic %) | Melting temperature (° C.) | Gas/Metal ratio (Nm³/kg) | Spray distance (mm) | Al—Ni intermetallic compound of 0.3 to 3 μm | Al—La—Cu intermetallic compound of 0.2 to 2 μm | Number of generation (Number/cm²) | Judgment |
| 1 | 0.02 | 0.30 | 0.50 | 950 | 8 | 1000 | 67.2 | 91.1 | 21 | B |
| 2 | 0.05 | 0.30 | 0.50 | 950 | 8 | 1000 | 79.8 | 91.5 | 7 | A |
| 3 | 0.40 | 0.30 | 0.50 | 950 | 8 | 1000 | 82.3 | 92.1 | 6 | A |
| 4 | 0.60 | 0.30 | 0.50 | 950 | 8 | 1000 | 87.3 | 90.9 | 4 | A |
| 5 | 1.0 | 0.30 | 0.50 | 950 | 8 | 1000 | 92.9 | 92.1 | 3 | A |
| 6 | 5.0 | 0.30 | 0.50 | 950 | 8 | 1000 | 85.2 | 90.4 | 6 | A |

TABLE 1-continued

| | | | | | | | Area ratio of intermetallic compound (%) | | Initial splashing | |
| --- | --- | --- | --- | --- | --- | --- | --- | --- | --- | --- |
| No. | Ni (atomic %) | La (atomic %) | Cu (atomic %) | Melting temperature (° C.) | Gas/Metal ratio (Nm$^3$/kg) | Spray distance (mm) | Al—Ni intermetallic compound of 0.3 to 3 μm | Al—La—Cu intermetallic compound of 0.2 to 2 μm | Number of generation (Number/cm$^2$) | Judgment |
| 7 | 6.0 | 0.30 | 0.50 | 950 | 8 | 1000 | 68.4 | 90.6 | 20 | B |
| 8 | 1.0 | 0.05 | 0.50 | 950 | 8 | 1000 | 90.2 | 66.5 | 23 | B |
| 9 | 1.0 | 0.10 | 0.50 | 950 | 8 | 1000 | 91.5 | 89.7 | 5 | A |
| 10*[1] | 1.0 | 0.30 | 0.50 | 950 | 8 | 1000 | 92.9 | 92.1 | 3 | A |
| 11 | 1.0 | 1.0 | 0.50 | 950 | 8 | 1000 | 91.1 | 90.4 | 5 | A |
| 12 | 1.0 | 1.5 | 0.50 | 950 | 8 | 1000 | 90.3 | 67.1 | 22 | B |
| 13 | 1.0 | 0.30 | 0.05 | 950 | 8 | 1000 | 92.1 | 68.1 | 20 | B |
| 14 | 1.0 | 0.30 | 0.10 | 950 | 8 | 1000 | 91.7 | 88.6 | 5 | A |
| 15*[1] | 1.0 | 0.30 | 0.50 | 950 | 8 | 1000 | 92.9 | 92.1 | 3 | A |
| 16 | 1.0 | 0.30 | 2.0 | 950 | 8 | 1000 | 92.3 | 90.2 | 4 | A |

*[1]Nos. 10, 15 are identical with No. 5.

TABLE 2

| | | | | | | | Area ratio of intermetallic compound (%) | | Initial splashing | |
| --- | --- | --- | --- | --- | --- | --- | --- | --- | --- | --- |
| No. | Ni (atomic %) | La (atomic %) | Cu (atomic %) | Melting temperature (° C.) | Gas/Metal ratio (Nm$^3$/kg) | Spray distance (mm) | Al—Ni intermetallic compound of 0.3 to 3 μm | Al—La—Cu intermetallic compound of 0.2 to 2 μm | Number of generation (Number/cm$^2$) | Judgment |
| 17 | 1.0 | 0.30 | 2.5 | 950 | 8 | 1000 | 88.7 | 66.4 | 27 | B |
| 18*[2] | 1.0 | 0.30 | 0.50 | 800 | — | 1000 | — | — | — | — |
| 19 | 1.0 | 0.30 | 0.50 | 850 | 8 | 1000 | 90.3 | 91.5 | 4 | A |
| 20*[1] | 1.0 | 0.30 | 0.50 | 950 | 8 | 1000 | 92.9 | 92.1 | 3 | A |
| 21 | 1.0 | 0.30 | 0.50 | 1000 | 8 | 1000 | 87.6 | 88.4 | 7 | A |
| 22 | 1.0 | 0.30 | 0.50 | 1100 | 8 | 1000 | 65.3 | 86.3 | 18 | B |
| 23 | 1.0 | 0.30 | 0.50 | 950 | 5 | 1000 | 64.4 | 84.7 | 19 | B |
| 24 | 1.0 | 0.30 | 0.50 | 950 | 6 | 1000 | 88.3 | 87.9 | 7 | A |
| 25 | 1.0 | 0.30 | 0.50 | 950 | 7 | 1000 | 90.5 | 89.2 | 5 | A |
| 26*[1] | 1.0 | 0.30 | 0.50 | 950 | 8 | 1000 | 92.9 | 92.1 | 3 | A |
| 27 | 1.0 | 0.30 | 0.50 | 950 | 8 | 800 | 67.6 | 86.2 | 17 | B |
| 28 | 1.0 | 0.30 | 0.50 | 950 | 8 | 900 | 88.8 | 89.5 | 6 | A |
| 29*[1] | 1.0 | 0.30 | 0.50 | 950 | 8 | 1000 | 92.9 | 92.1 | 3 | A |
| 30 | 1.0 | 0.30 | 0.50 | 950 | 8 | 1200 | 90.3 | 91.4 | 4 | A |
| 31*[3] | 1.0 | 0.30 | 0.50 | 950 | 8 | 1300 | — | — | — | — |

*[1]Nos. 20, 26 and 29 are identical with No. 5
*[2]Nozzle was clogged in spray forming
*[3]Yield was lowered in spray forming From Tables 1 and 2, it can be considered as described below.

In Nos. 2 to 6, 9 to 11, 14 to 16, 19 to 21, 24 to 26 and 28 to 30, since the grain size distributions of the Al—Ni intermetallic compounds of the Al—Ni—La—Cu alloy sputtering targets and the Al—La—Cu intermetallic compounds of the Al—Ni—La—Cu alloy sputtering targets are properly controlled, the number of generation of the initial splashing remains to less than 8 Number/cm$^2$ and the effect of decreasing the initial splashing was excellent.

On the contrary, No. 1 is an example of using the Al-based alloy with less Ni amount, No. 7 is an example of using the Al-based alloy with more Ni amount, No. 8 is an example of using the Al-based alloy with less La amount, No. 12 is an example of using the Al-based alloy with more La amount, No. 13 is an example of using the Al-based alloy with less Cu amount, and No. 17 is an example of using the Al-based alloy with more Cu amount and, since the area ratio of the Al—Ni intermetallic compound and that of the Al—La—Cu intermetallic compound capable of contributing to the prevention for the generation of the initial splashing were small in any of them, the generation of the initial splashing could not be prevented effectively.

No. 18 is an example in which the temperature of melting the Al—Ni—La—Cu alloy was low and, since the nozzle was clogged in the spray forming, the spray forming was discontinued and, accordingly, subsequent scanning electron microscope observation and image analysis could not be performed.

No. 22 is an example in which the temperature of melting the Al—Ni—La—Cu alloy was high and, since the area ratio of the Al—Ni intermetallic compound capable of contributing to the prevention for the generation of the initial splashing was small, the generation of the initial splashing could not be prevented effectively.

No. 23 is an example in which the gas/metal ratio in the step of gas-atomizing the molten metal of the Al—Ni—La—Cu alloy was low and, since the area ratio of the Al—Ni intermetallic compound capable of contributing to the prevention for the generation of the initial splashing was small, the generation of the initial splashing could not be prevented effectively.

No. 27 is an example in which the spray distance in the step of depositing the Al—Ni—La—Cu alloy on the collector was short and, since the area ratio of the Al—Ni intermetallic compound capable of contributing to prevention for the generation of the initial splashing was small, the generation of the initial splashing could not be prevented effectively.

No. 31 is an example in which the spray distance in the step of depositing the Al—Ni—La—Cu alloy on the collector was long, and the yield was lowered in the spray forming. Accordingly, the product could not be served to the subsequent steps, and scanning electron microscope observation and image analysis could not be performed.

The invention claimed is:

1. An aluminum alloy sputtering target, comprising:
Al,
from 0.05 atomic % to 5 atomic % of Ni,
from 0.10 atomic % to 1 atomic % of La, and
from 0.10 atomic % to 2 atomic % of Cu, wherein
the Al and Ni form a spherical Al—Ni intermetallic compound,
the Al, La, and Cu form a spherical Al—La—Cu intermetallic compound,
a total area of an Al—Ni intermetallic compound having an average grain size in the aluminum alloy of from 0.3 µm to 3 µm is 70% or more by area ratio based on an entire area of the Al—Ni intermetallic compound,
a total area of an Al—La—Cu intermetallic compound having an average grain size in the aluminum alloy of from 0.2 µm to 2 µm is 70% or more by area ratio based on an entire area of the Al—La—Cu intermetallic compound, and
the percentages are determined by observing a portion of the sputtering target within a region of from ¼t to ¾t along a cross section vertical to a plane of the sputtering target by using a scanning electron microscope at a magnification of 2000, wherein t represents a thickness of the sputtering target in a direction vertical to a plane of the sputtering target.

2. The aluminum alloy sputtering target according to claim 1, wherein Ni is present in the alloy in an amount of from 0.1 atomic % to 4 atomic %.

3. The aluminum alloy sputtering target according to claim 1, wherein Ni is present in the alloy in an amount of from 0.2 atomic % to 3 atomic %.

4. The aluminum alloy sputtering target according to claim 1, wherein La is present in the alloy in an amount of from 0.15 atomic % to 0.8 atomic %.

5. The aluminum alloy sputtering target according to claim 1, wherein La is present in the alloy in an amount of from 0.2 atomic % to 0.6 atomic %.

6. The aluminum alloy sputtering target according to claim 1, wherein Cu is present in the alloy in an amount of from 0.10 atomic % to 1 atomic %.

7. The aluminum alloy sputtering target according to claim 1, further comprising at least one member selected from the group consisting of Fe, Si, C, O and N.

8. The aluminum alloy sputtering target according to claim 1, further comprising at least one member selected from the group consisting of Fe, Si, C, O and N, wherein
Fe is present in an amount of 0.05 wt. % or less,
Si is present in an amount of 0.05 wt. % or less,
C is present in an amount of 0.05 wt. % or less,
O is present in an amount of 0.05 wt. % or less, and
N is present in an amount of 0.05 wt. % or less.

9. The aluminum alloy sputtering target according to claim 1, wherein
the Al—Ni intermetallic compound is a binary Al—Ni intermetallic compound; and
the Al—La—Cu intermetallic compound is a ternary Al—La—Cu intermetallic compound.

10. The aluminum alloy sputtering target according to claim 1, wherein the Al—Ni intermetallic compound is Al$_3$Ni.

11. The aluminum alloy sputtering target according to claim 1, wherein the Al—La—Cu intermetallic compound is Al$_7$La$_2$Cu.

12. The aluminum alloy sputtering target according to claim 1, wherein the Al—Ni intermetallic compound is Al$_3$Ni, and
the Al—La—Cu intermetallic compound is Al$_7$La$_2$Cu.

13. The aluminum alloy sputtering target according to claim 1, further comprising at least two members selected from the group consisting of Fe, Si, C, O and N, wherein
Fe is present in an amount of 0.05 wt. % or less,
Si is present in an amount of 0.05 wt. % or less,
C is present in an amount of 0.05 wt. % or less,
O is present in an amount of 0.05 wt. % or less, and
N is present in an amount of 0.05 wt. % or less.

14. The aluminum alloy sputtering target according to claim 1, further comprising at least three members selected from the group consisting of Fe, Si, C, O and N, wherein
Fe is present in an amount of 0.05 wt. % or less,
Si is present in an amount of 0.05 wt. % or less,
C is present in an amount of 0.05 wt. % or less,
O is present in an amount of 0.05 wt. % or less, and
N is present in an amount of 0.05 wt. % or less.

15. The aluminum alloy sputtering target according to claim 1, further comprising at least four members selected from the group consisting of Fe, Si, C, O and N, wherein
Fe is present in an amount of 0.05 wt. % or less,
Si is present in an amount of 0.05 wt. % or less,
C is present in an amount of 0.05 wt. % or less,
O is present in an amount of 0.05 wt. % or less, and
N is present in an amount of 0.05 wt. % or less.

16. The aluminum alloy sputtering target according to claim 1, further comprising Fe, Si, C, O and N, wherein
Fe is present in an amount of 0.05 wt. % or less,
Si is present in an amount of 0.05 wt. % or less,
C is present in an amount of 0.05 wt. % or less,
O is present in an amount of 0.05 wt. % or less, and
N is present in an amount of 0.05 wt. % or less.

17. The aluminum alloy sputtering target according to claim 1, wherein Ni is present in the alloy in an amount of from 0.1 atomic % to 4 atomic %, and
the Al—Ni intermetallic compound is Al$_3$Ni.

18. The aluminum alloy sputtering target according to claim 1, wherein Ni is present in the alloy in an amount of from 0.2 atomic % to 3 atomic %, and
the Al—Ni intermetallic compound is Al$_3$Ni.

19. The aluminum alloy sputtering target according to claim 1, wherein Ni is present in the alloy in an amount of from 0.2 atomic % to 3 atomic %,
La is present in the alloy in an amount of from 0.15 atomic % to 0.8 atomic %,
the Al—Ni intermetallic compound is Al$_3$Ni, and
the Al—La—Cu intermetallic compound is Al$_7$La$_2$Cu.

20. A method of manufacturing the Al—Ni—La—Cu alloy sputtering target according to claim 1, which comprises
obtaining a molten metal at 850 to 1000° C. of an Al—Ni—La—Cu alloy comprising Ni in an amount of 0.05 atomic % or more and 5 atomic % or less, La in an amount of 0.10 atomic % or more and 1 atomic % or less and Cu in an amount of 0.10 atomic % or more and 2 atomic % or less;
gas-atomizing the molten metal of the Al-based alloy at a gas/metal ratio of 6 Nm$^3$/kg or more to refine the Al-based alloy;
depositing the refined Al-based alloy on a collector under a condition of a spray distance of from 900 to 1200 mm to obtain a preform of the Al-based alloy;

densifying the preform of the Al-based alloy by a densifying means to obtain a dense body of the Al-based alloy;

subjecting the dense body of the Al-based alloy to plastic working to obtain a plastic worked body of the Al-based alloy; and subjecting the plastic worked body of the Al-based alloy to heat treatment or annealing.

* * * * *